United States Patent
Lee

(10) Patent No.: US 8,310,314 B2
(45) Date of Patent: Nov. 13, 2012

(54) SIGNAL AMPLIFICATION CIRCUITS FOR RECEIVING/TRANSMITTING SIGNALS ACCORDING TO INPUT SIGNAL

(75) Inventor: Chih-Hung Lee, Chiayi Hsien (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 64 days.

(21) Appl. No.: 12/876,237

(22) Filed: Sep. 6, 2010

(65) Prior Publication Data

US 2012/0056681 A1 Mar. 8, 2012

(51) Int. Cl.
*H03F 3/68* (2006.01)

(52) U.S. Cl. ......... 330/311; 330/295

(58) Field of Classification Search ......... 330/51, 330/254, 311
See application file for complete search history.

(56) References Cited

U.S. PATENT DOCUMENTS

| | | | | |
|---|---|---|---|---|
| 5,057,787 | A * | 10/1991 | Arai et al. | 330/254 |
| 7,170,350 | B2 * | 1/2007 | Ryynanen et al. | 330/254 |
| 7,276,976 | B2 * | 10/2007 | Oh et al. | 330/311 |
| 7,482,879 | B2 * | 1/2009 | Koutani et al. | 330/311 |
| 7,800,450 | B2 * | 9/2010 | Park et al. | 330/311 |
| 7,859,340 | B2 * | 12/2010 | Miao et al. | 330/298 |
| 2008/0231369 | A1 * | 9/2008 | Kim et al. | 330/278 |
| 2009/0261903 | A1 * | 10/2009 | Touzard et al. | 330/254 |

OTHER PUBLICATIONS

Reiha, A 1.2V Reactive-Feedback 3.1-10.6 GHz Low-Noise Amplifier in 0.13 um CMOS, pp. 1023-1033, IEEE Journal of Solid-State Circuits, vol. 42, No. 5, May 2007.
Perumana, Resistive-Feedback CMOS Low-Noise Amplifiers for Multiband Applications, pp. 1218-1225, IEEE Transactions on Microwave Theory and Techniques, vol. 56, No. 5, May 2008.
Giannini, A 2-mm^2 0.1-5 GHz Software-Defined Radio Receiver in 45-nm Digital CMOS, pp. 3486-3498, IEEE Journal of Solid-State Circuits, vol. 44, No. 12, Dec. 2009.
Borremans, Low-Area Active-Feedback Low-Noise Amplifier Design in Scaled Digital CMOS, pp. 2422-2433, IEEE Journal of Solid-State Circuits, vol. 43, No. 11, Nov. 2008.

* cited by examiner

*Primary Examiner* — Robert Pascal
*Assistant Examiner* — Khiem Nguyen
(74) *Attorney, Agent, or Firm* — Winston Hsu; Scott Margo

(57) ABSTRACT

One exemplary signal amplification circuit used for processing an input signal includes an input stage, a plurality of output stages, and a selecting stage. The input stage has an input node for receiving the input signal and an output node for outputting an intermediate signal. The output stages are coupled to a plurality of output ports of the signal amplification circuit, respectively. Each of the output stages generates a corresponding processed signal to a corresponding output port according to a gain and a signal derived from the intermediate signal of the input stage when enabled. The selecting stage is arranged for selectively coupling the output node of the input stage to at least one of the output stages.

18 Claims, 8 Drawing Sheets

SIGNAL AMPLIFICATION CIRCUITS FOR RECEIVING/TRANSMITTING SIGNALS ACCORDING TO INPUT SIGNAL

BACKGROUND

The disclosed embodiments of the present invention relate to amplifying an input signal, and more particularly, to signal amplification circuits which receive/transmit signals according to an input signal.

As people around the world embrace mobile lifestyles, there is a growing demand for their mobile devices to support several different kinds of radio connections. For example, a mobile device may have multiple wireless connections (e.g., a Bluetooth connection and a WiFi connection) at the same time. If transmitters/receivers for different radio connections are implemented in a multi-radio device individually, the hardware cost and the chip size may be high. Therefore, regarding a multi-radio device, there is a need for receiving/transmitting signals according to one input. For example, if a low-noise amplifier (LNA) of the multi-radio device can be configured to commonly amplify a plurality of radio-frequency signals, the LNA shared between different radio connections, such as the Bluetooth connection and the WiFi connection, would reduce the hardware cost and the chip size of the multi-radio device. Thus, designing a signal amplification circuit which can receive/transmit signals according to one input becomes an important issue for designers in this field.

SUMMARY

In accordance with exemplary embodiments of the present invention, signal amplification circuits which receive/transmit signals according to an input signal are proposed to solve the above-mentioned problem.

According to a first aspect of the present invention, an exemplary signal amplification circuit is disclosed. The exemplary signal amplification circuit is for processing an input signal, and includes an input stage, a plurality of output stages, and a selecting stage. The input stage has an input node for receiving the input signal and an output node for outputting an intermediate signal. The output stages are coupled to a plurality of output ports of the signal amplification circuit, respectively. Each of the output stages generates a corresponding processed signal to a corresponding output port according to a gain and a signal derived from the intermediate signal of the input stage when enabled. The selecting stage is arranged for selectively coupling the output node of the input stage to at least one of the output stages.

According to a second aspect of the present invention, an exemplary signal amplification circuit is disclosed. The exemplary signal amplification circuit is for processing an input signal and includes a plurality of individual amplifier blocks. The individual amplifier blocks are coupled to a plurality of output ports of the signal amplification circuit, respectively. Each of the individual amplifier blocks includes: an input stage, having an input node for receiving the input signal; an output stage, coupled to a corresponding output port of the signal amplification circuit, for generating a corresponding processed signal to the corresponding output port according to a gain and a signal derived from an intermediate signal of the input stage; and a selecting stage arranged for selectively coupling the input stage to the output stage.

According to a third aspect of the present invention, an exemplary signal amplification circuit is disclosed. The exemplary signal amplification circuit is for processing an input signal, and includes an input stage and a plurality of output stages. The input stage has an input node for receiving the input signal and a plurality of output nodes. The output stages are coupled to a plurality of output ports of the signal amplification circuit, respectively. In addition, the output stages are directly connected to the output nodes of the input stage, respectively. Each of the output stages generates a corresponding processed signal to a corresponding output port according to a gain and a signal derived from an intermediate signal of the input stage when enabled.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
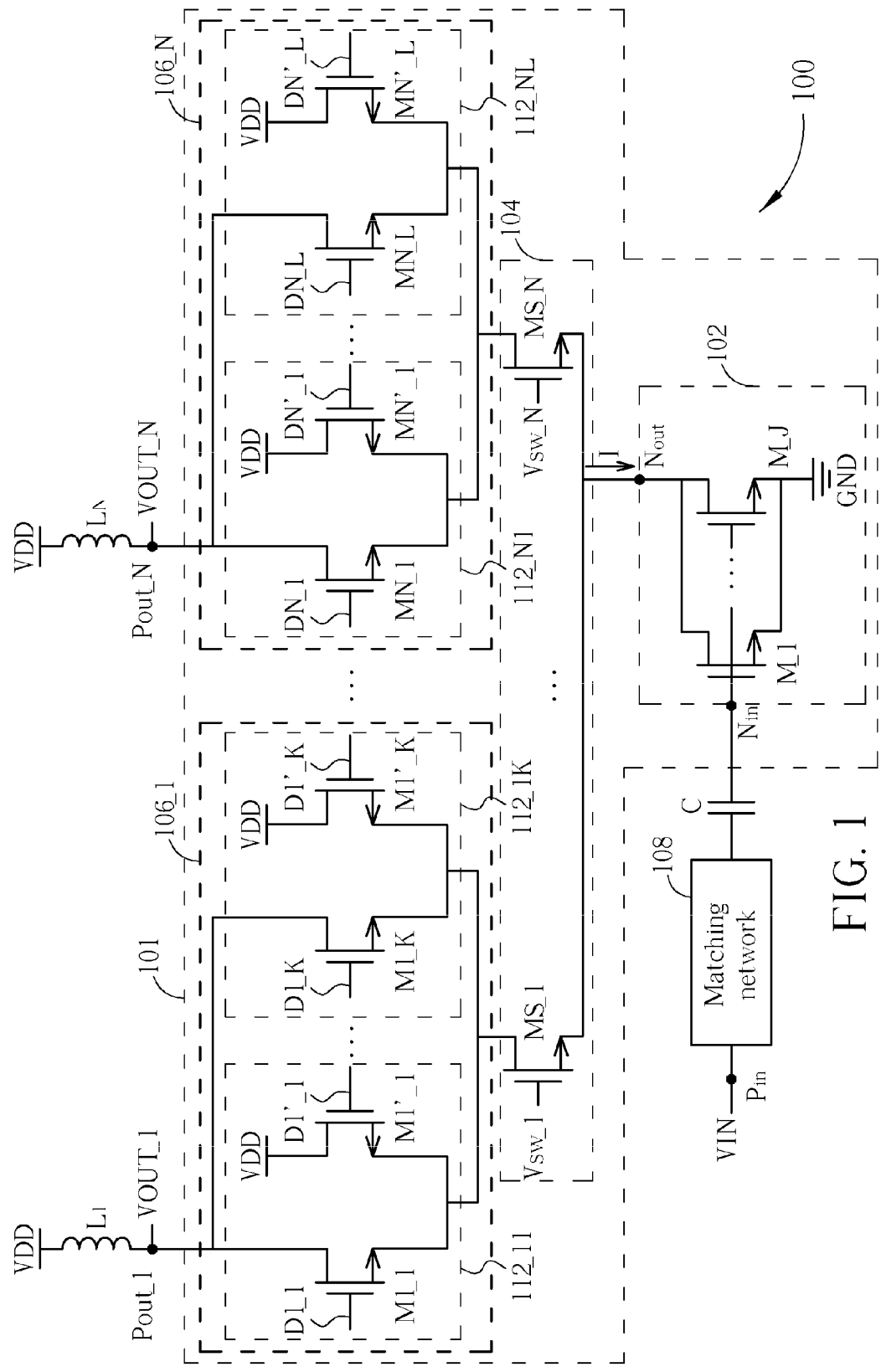
FIG. 1 is a diagram illustrating a first exemplary implementation of a signal amplification circuit according to the present invention.

FIG. 1 is a diagram illustrating a first exemplary implementation of a signal amplification circuit according to the present invention. The exemplary signal amplification circuit 100 is for processing an input signal VIN to be received/transmitted. In other words, the signal amplification circuit 100 can be part of a receiver or part of a transmitter. For example, regarding signal reception, the input signal VIN may include a plurality of a radio-frequency signals (e.g., a Bluetooth signal and a WiFi signal) received by a single antenna (not shown), and a plurality of received signals corresponding to the radio-frequency signals are generated as outputs of the signal amplification circuit 100. Regarding signal transmission, a plurality of signals to be transmitted are generated as outputs of the signal amplification circuit 100 according to the same radio-frequency signal included in the input signal VIN. In this exemplary implementation, the signal amplification circuit 100 includes an amplifier block 101 and a matching network 108. The amplifier block 101 includes, but is not limited to, an input stage 102, a selecting stage 104, and a plurality of output stages 106_1-106_N. The matching network 108 is coupled between an input port $P_{in}$ of the signal amplification circuit 100 and an input node $N_{in}$ of the input stage 102, and implemented for providing desired impedance matching. In a case where the signal amplification circuit 100 serves as a low-noise amplifier in a receiver of a multi-radio device, the signal amplification circuit 100 is capable of supporting multiple radio connections such as a Bluetooth connection and a WiFi connection. Therefore, the matching network (e.g., a broadband matching network) 108 should be properly designed to meet the impedance matching requirements of the supported radio connections.

The input signal VIN is received by the input node $N_{in}$ of the input stage 102 via the matching network 108. In addition, an alternating-current (AC) coupling capacitor C is also placed between the matching network 108 and the input stage 102. Therefore, the input signal VIN passing through the matching network 108 and the AC coupling capacitor C is then processed by the input stage 102 according to a transconductance of the input stage 102. As shown in FIG. 1, the input stage 102 includes a plurality of transistors M_1-M_J connected in parallel for setting the transconductance of the input stage 102. Regarding each of the transistors M_1-M_J, a control terminal (e.g., a gate electrode) is coupled to the input node $N_{in}$, and connection terminals (e.g., a drain electrode and a source electrode) are coupled to an output node $N_{out}$ of the input stage 102 and a reference voltage (e.g., a ground voltage GND), respectively. It should be noted that the parallel connection of transistors can be regarded as a single transistor with an equivalent size. That is, the input stage 102 is implemented by a transistor element made of a single transistor or made of a plurality of transistors connected in parallel and having gate electrodes connected to each. Due to a proper transconductance setting of the input stage 102, the input signal VIN is converted into an intermediate signal I at the output node $N_{out}$ of the input stage 102. It should be noted that the input impedance of the input stage 102 viewed from the matching network 108 can be fixed while the number of turned-on transistors M_1-M_J is fixed regardless of the operation mode at which the signal amplification circuit 100 stays. Taking a receiver which has the signal amplification circuit 100 employed therein for example, the noise figure is low under such an amplifier configuration shown in FIG. 1.

The selecting stage 104 is utilized for selectively coupling the output node $N_{out}$ to at least one of the output stages 106_1-106_N. In this exemplary implementation, the selecting stage 104 includes a plurality of transistor elements MS_1-MS_N coupled to the output stages 106_1-106_N, respectively. The transistor elements MS_1-MS_N act as switches controlled by control signals $V_{SW\_}1$-$V_{SW\_}N$, respectively. More specifically, each of the transistor elements MS_1 -MS_N has a control terminal for receiving a corresponding control signal, a first connection terminal coupled to a corresponding output stage, and a second connection terminal coupled to the output node $N_{out}$ of the input stage 102.

The output stages 106_1-106_N are coupled to a plurality of output ports $P_{out\_}1$-$P_{out\_}N$ of the signal amplification circuit 100, respectively. The output stages 106_1-106_N are configured to generate a plurality of processed signals VOUT_1-VOUT_N, respectively. More specifically, each of the output stages 106_1-106_N generates a corresponding processed signal to a corresponding output port according to a gain and a signal derived from the intermediate signal I of the input stage 102 when enabled. In this exemplary implementation, each output stage includes a plurality of transistor elements. As shown in FIG. 1, the output stage 106_1 includes a plurality of transistor element pairs 112_11-112_1K, wherein each of the transistor element pairs 112_11-112_1K includes a first transistor element (e.g., M1_1, . . . , or M1_K) and a second transistor element (e.g., M1'_1, . . . , or M1'_K). Similarly, the output stage 106_N includes a plurality of transistor element pairs 112_N1-112_NL, wherein each of the transistor element pairs 112_N1-112_NL includes a first transistor element (e.g., MN_1, . . . , or MN_L) and a second transistor element (e.g., MN'_1, . . . , or MN'_L). The first transistor elements have control terminals for receiving first control signals D1_1-D1_K, . . . , and DN_1-DN_L, first connection terminals coupled to corresponding output ports $P_{\_out\_}1$-$P_{\_out\_}N$, and second connection terminals coupled to the selecting stage 104; in addition, the second transistor elements M1'_1-M1'_K, . . . , and MN'_1 -MN'_L have control terminals for receiving second control signals D1'_1-D1'_K, . . . , and DN'_1-DN'_L, first connection terminals coupled to a reference voltage (e.g., the supply voltage VDD), and second connection terminals coupled to the selecting stage 104.

It should be noted that the number of transistor element pairs in one output stage may be adjustable according to actual design requirements. For example, in one embodiment, the number of transistor element pairs 112_11-112_1K may be equal to the number of transistor element pairs 112_N1-112_NL; however, in another embodiment, the number of transistor element pairs 112_11-112_1K may be different from the number of transistor element pairs 112_N1-112_NL.

Regarding each of the output stages 106_1-106_N, the gain can be adaptively adjusted by controlling an on/off status of each transistor element included in the output stage. Taking the output stage 106_1 for example, only one of the first transistor element and the second transistor element included in each transistor element pairs is turned on to control the current passing through a corresponding inductive load (i.e., the inductor $L_1$). That is, a second transistor element in a transistor element pair is turned off by a second control signal when a first transistor element included in the same transistor element pair is turned on by a first control signal, and the first transistor element is turned off by the first control signal when the second transistor element is turned on by the second control signal. Therefore, the current passing through the inductor $L_1$ has a maximum value (i.e., the current passing through the turned-on transistor element MS_1) when all of the first transistor elements M1_1-M1_K are turned on under the control of the first control signals D1_1-D1_K and all of the second transistor elements M1'_1-M1'_K are turned off under the control of the second control signals D1'_1-D1'_K. Similarly, regarding the output stage 106_N, the current passing through a corresponding inductive load (i.e., the inductor $L_N$) has a maximum value (e.g., the current passing through the turned-on transistor element MS_N) when all of the first transistor elements MN_1-MN_L are turned on under the control of the first control signals DN_1-DN_L and all of the second transistor elements MN'_1-MN'_L are turned off under the control of the second control signals DN'_1-DN'_L. To put it simply, the more the turned-on first transistor elements in an output stage, the greater the current passing through an inductive load coupled to the output stage. In this way, the gain of the output stage can be properly set to a desired value.

The exemplary signal amplification circuit 100 can operate under an operational mode being either a shared mode or a combo mode. The switching between the shared mode and the combo mode can be controlled by the selecting stage 104 or the output stages 106_1-106_N. Assume that the selecting stage 104 is used to control the operational mode of the signal amplification circuit 100. When only one of the transistor elements MS_1-MS_N is turned on, the signal amplification circuit 100 operates under the shared mode as only one of the output stages 106_1-106_N is allowed to be connected to the input stage 102. For example, the output port $P_{out}\_1$ is coupled to a first radio signal processing system (e.g., a WiFi receiver/transmitter) and the output port $P_{out}\_N$ is coupled to a second radio signal processing system (e.g., a Bluetooth receiver/transmitter). When only the WiFi function of the multi-radio device is required to be active, the transistor element MS_1 is turned on, whereas the remaining transistor elements in the selecting stage 104 are turned off. In addition, the gain of the enabled output stage 106_1 should be properly configured to meet the WiFi requirements. Similarly, when only the Bluetooth function of the multi-radio device is required to be active, the transistor element MS_N is turned on, whereas the remaining transistor elements in the selecting stage 104 are turned off. In addition, the gain of the enabled output stage 106_N should be properly configured to meet the requirements of the Bluetooth requirements.

However, when a plurality of specific transistor elements in the selecting stage 104 are turned on concurrently, the signal amplification circuit 100 operates under the combo mode as a plurality of specific output stages included in the output stages 106_1-106_N are allowed to be connected to the input stage 102 at the same time. For example, when both of the WiFi function and Bluetooth function of the multi-radio device are required to be active, the transistor elements MS_1 and MS_N are both turned on, whereas the remaining transistor elements in the selecting stage 104 are turned off. In addition, the gains of the concurrently enabled output stages 106_1 and 106_N should be properly configured to meet the requirements. It should be noted that the selecting stage 104 in this exemplary implementation is also arranged to increase isolation (or decrease coupling) between the specific output stages (e.g., output stages 106_1 and 106_N) which are concurrently enabled. In a case where the selecting stage 104 is omitted, the output stages 106_1-106_N would be directly connected to the input stage 102. When the output stage 106_N is controlled to adjust it gain, the coupling effect between the concurrently enabled output stages 106_N and 106_1 results in a significant gain variation of the output stage 106_1. However, with the help of the selecting stage 104 implemented between output stages, the undesired coupling effect can be effectively mitigated. Therefore, when the output stage 106_N is controlled to adjust it gain, the gain variation of the output stage 106_1 caused by the gain tuning operation of the output stage 106_N can be reduced due to increased isolation provided by the selecting stage 104 implemented between the output stages 106_N and 106_1.

In an alternative design, the output stages 106_1-106_N may be used to control the operational mode of the signal amplification circuit 100. In other words, in addition to setting the gain applied to a signal passing therethrough, each of the output stages 106_1-106_N is further arranged to determine if a processed signal is generated at a corresponding output port, and therefore control whether the output stage should be enabled. Taking the output stage 106_1 for example, if the output stage 106_1 is required to be enabled for generating the corresponding processed signal VOUT_1, the output stage 106_1 is enabled by making each of the transistor element pairs 112_11-112_1K have one turned-on transistor element and one turned-off transistor element. However, if the output stage 106_1 is not required to be enabled for generating the corresponding processed signal VOUT_1, the output stage 106_1 is disabled by turning off both of the first transistor element and the second transistor element included in each of the transistor element pairs 112_11-112_1K. As a result, when the output stage 106_1 is disabled, the transistor element MS_1 will be turned off regardless of the voltage level of the control voltage $V_{SW}\_1$. In one exemplary design, each of the control voltages $V_{SW}\_1$-$V_{SW}\_N$ is at a high logic level, and the output stages 106_1-106_N control the signal amplification circuit 100 to operate under the shared mode or combo mode by properly setting the first control signals M1_1-M1_K, ..., and MN_1-MN_K and the second control signals M1'_1-M1'_L, ..., and MN'_1-MN'_L. For example, when only the WiFi function of the multi-radio device is required to be active (i.e., the signal amplification circuit 100 should operate under the shared mode), the output stage 106_1 is enabled, whereas the remaining output stages are disabled. In addition, the gain of the enabled output stage 106_1 should be properly configured to meet the WiFi requirements. Similarly, when only the Bluetooth function of the multi-radio device is required to be active (i.e., the signal amplification circuit 100 should operate under the shared mode), the output stage 106_N is enabled, whereas the remaining output stages are disabled. In addition, the gain of the enabled output stage 106_N should be properly configured to meet the Bluetooth requirements. However, when both of the WiFi function and Bluetooth function of the multi-radio device are required to be active (i.e., the signal amplification circuit 100 should operate under the combo mode), the output stages 106_1 and 106_N are both enabled, whereas the remaining output stages are disabled. In addition, the gains of the concurrently enabled output stages 106_1 and 106_N should be properly configured to meet the WiFi requirements and Bluetooth requirements.

Figure 2:
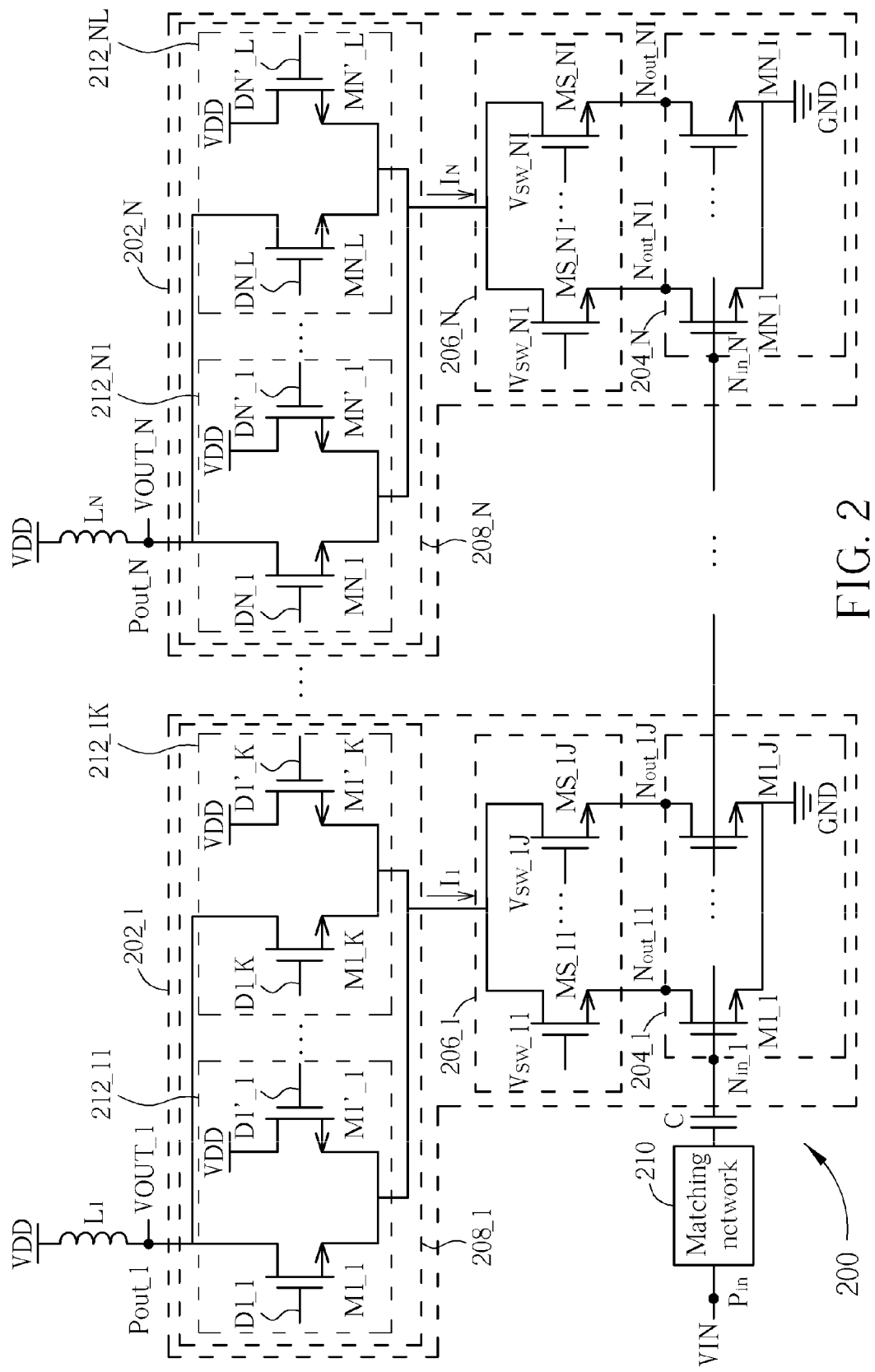
FIG. 2 is a diagram illustrating a second exemplary implementation of a signal amplification circuit according to the present invention.

FIG. 2 is a diagram illustrating a second exemplary implementation of a signal amplification circuit according to the present invention. Similar to the exemplary signal amplification circuit 100 mentioned above, the exemplary signal amplification circuit 200 is for processing the input signal VIN to be received or transmitted. That is, the signal amplification circuit 200 can be part of a receiver or part of a transmitter. In this exemplary implementation, the signal amplification circuit 200 includes a plurality of amplifier blocks 202_1-202_N and a matching network 210. Each of the amplifier blocks 202_1-202_N includes, but is not limited to, an input stage 204_1, ..., or 204_N, a selecting stage 206_1, ..., or 206_N, and an output stages 208_1, ..., or 208_N. Please note that the amplifier blocks 202_1-202_N can be individual functional blocks, meaning that each of the amplifier blocks 202_1-202_N respectively has its own input stage, selecting stage, and output stage. More specifically, none of the input stage, selecting stage, and output stage belonging to one individual amplifier block is shared with other individual amplifier block(s). The matching network 210 is coupled between an input port $P_{in}$ of the signal amplification circuit 200 and the input nodes $N_{in\_}1$-$N_{in\_}N$ of the respective input stages 204_1 -204_N, and implemented for providing desired impedance matching. The matching network (e.g., a broadband matching network) 210 should be properly designed to meet the impedance matching requirements. The input signal VIN is transmitted to the input nodes $N_{in\_}1$-$N_{in\_}N$ of the input stages 204_1 -204_N via the matching network 210 and an AC coupling capacitor C. Each of the input stages 204_1-204_N has a plurality of output nodes. For example, the input stages 204_1 includes output nodes $N_{out\_}11$-$N_{out\_}1J$, and the input stages 204_N includes output nodes $N_{out\_}N1$-$N_{out\_}NI$. Each of the input stages 204_1 -204_N includes a plurality of transistor elements M1_1-M1_J, . . . , or MN_1-MN_I each having a control terminal coupled to the input node of the input stage, a first connection terminal coupled to an output node of the input stage, and a second connection terminal coupled to a reference voltage (e.g., the ground voltage GND). As shown in FIG. 2, second connection terminals of the transistor elements in the same input stage are connected to each other. It should be noted that each of the input stages 204_1 -204_N is not required to have the same number of transistor elements. That is, the number of transistor elements implemented in each of the input stages 204_1 -204_N can be adjusted according to actual design consideration. The transistor elements in each input stage are used to control the transconductance of the input stage. For example, the transconductance of the input stage would be increased when more transistor elements included in the input stage are turned on.

In each amplifier block, the selecting stage 206_1, . . . , or 206_N is used to selectively couple the input stage 204_1, . . . , or 204_N to the output stage 208_1, . . . , or 208_N, and includes a plurality of transistor elements MS_11-MS_1J, . . . , or MS_N1-MS_NI. For example, the selecting stage 206_1 selectively couples the input stage 204_1 to the output stage 208_1, and includes transistor elements MS_11-MS_1J each having a control terminal for receiving a control signal VSW_11, . . . , or VSW_1J, a first connection terminal coupled to the output stage 208_1, and a second connection terminal coupled to a corresponding output node $N_{out\_}11$, . . . , or $N_{out\_}1J$ of the input stage 204_1. Similarly, the selecting stage 206_N selectively couples the input stage 204_N to the output stage 208_N, and includes transistor elements MS_N1-MS_NI each having a control terminal for receiving a control signal VSW_N1, . . . , or VSW_NI, a first connection terminal coupled to the output stage 208_N, and a second connection terminal coupled to a corresponding output node $N_{out\_}N1$, . . . , or $N_{out\_}NI$ of the input stage 204_N. It should be noted that each transistor element in the selecting stages 206_1-206_N acts as a switch controlled by a corresponding control signal.

The output stages 208_1-208_N are coupled to a plurality of output ports $P_{out\_}1$-$P_{out\_}N$ of the signal amplification circuit 100, respectively, and are configured to generate a plurality of processed signals VOUT_1-VOUT_N, respectively. More specifically, in each amplifier block, the output stage is coupled to a corresponding output port of the signal amplification circuit 200, and implemented for generating a corresponding processed signal (e.g., VOUT_1, . . . , or VOUT_N) to the corresponding output port (e.g., $P_{out\_}1$, . . . , or $P_{out\_}N$) according to a gain and a signal derived from an intermediate signal (e.g., $I_1$, . . . , or $I_N$) of the input stage when enabled. As shown in FIG. 2, the output stage 208_1 includes a plurality of transistor element pairs 212_11-212_1K, wherein each of the transistor element pairs 212_11-212_1K includes a first transistor element (e.g., M1_1, . . . , or M1_K) and a second transistor element (e.g., M1'_1,..., or M1'_K). Similarly, the output stage 208_N includes a plurality of transistor element pairs 212_N1-212_NL, wherein each of the transistor element pairs 212_N1-212_NL includes a first transistor element (e.g., MN_1, . . . , or MN_L) and a second transistor element (e.g., MN'_1 , . . . , or MN'_L). Therefore, regarding the output stage 208_1, the current passing through a corresponding conductive load (e.g., the inductor $L_1$) has a maximum value (i.e., the current $I_1$ passing through the input stage 204_1 via the selecting stage 206_1) when all of the first transistor elements M1_1-M1_K are turned on under the control of the first control signals D1_1-D1_K and all of the second transistor elements M1'_1-M1'_K are turned off under the control of the second control signals D1'_1-D1'_K. Similarly, regarding the output stage 208_N, the current passing through a corresponding inductive load (i.e., the inductor $L_N$) has a maximum value (e.g., the current $I_N$ passing through the input stage 204_N via the selecting stage 206_N) when all of the first transistor elements MN_1-MN_K are turned on under the control of the first control signals DN_1-DN_K and all of the second transistor elements MN_1-MN'_K are turned off under the control of the second control signals DN'_1-DN'_K. As a person skilled in the art can readily understand operations of the output stages after reading above paragraphs directed to the output stages shown in FIG. 1, further description is therefore omitted here for brevity.

The signal amplification circuit 200 can operate under an operational mode being either a shared mode or a combo mode. The switching between the shared mode and the combo mode can be controlled by the selecting stages 206_1-206_N or the output stages 208_1-208_N. Assume that the selecting stages 206_1-206_N are used to control the operational mode of the signal amplification circuit 100. When only one of the selecting stages 206_1-206_N has turned-on transistor element(s), the signal amplification circuit 200 operates under the shared mode as only one of the output stages 208_1-208_N is allowed to be connected to a corresponding input stage. For example, the output port $P_{out\_}1$ is coupled to a first radio signal processing system (e.g., a WiFi receiver/transmitter) and the output port $P_{out\_}N$ is coupled to a second radio signal processing system (e.g., a Bluetooth receiver/transmitter). When only the WiFi function of the multi-radio device is required to be active, at least one of the transistor elements MS_11-MS_1J included in the selecting stage 206_1 is turned on, whereas all transistor elements in the remaining selecting stages of the signal amplification circuit 200 are turned off. In addition, the gain of the enabled output stage 208_1 should be properly configured to meet the WiFi requirements. Similarly, when only the Bluetooth function of the multi-radio device is required to be active, at least one of the transistor elements MS_N1-MS_NI included in the selecting stage 206_N is turned on, whereas all of the transistor elements in the remaining selecting stages of the signal amplification circuit 200 are turned off. In addition, the gain of the enabled output stage 208_N should be properly configured to meet the requirements of the Bluetooth requirements.

However, when selecting stages of a plurality of specific amplifier blocks in the signal amplification circuit 200 couple corresponding input stages of the specific amplifier blocks to corresponding output stages of the specific amplifier blocks concurrently, the signal amplification circuit 200 operates under the combo mode as more than one output stage is allowed to be connected to its corresponding input stage at the same time. For example, when both of the WiFi function and Bluetooth function of the multi-radio device are required to be active, at least one of the transistor elements MS_11-MS_1J in the selecting stage 206_1 and at least one of the transistor elements MS_N1-MS_NI in the selecting stage 206_N are turned on at the same time, whereas all of the transistor elements in the remaining selecting stages of the signal amplification circuit 200 are turned off. In addition, the gains of the concurrently enabled output stages 208_1 and 208_N should be properly configured to meet the requirements. It should be noted that the signal amplification circuit 200 is capable of providing high isolation for concurrently enabled output stages due to the fact that a plurality of independent/individual input stages are implemented therein.

As mentioned above, an output stage of an amplifier block is enabled when at least one transistor element of a selecting stage in the same amplifier is turned on. Besides, the transconductance of an input stage in the same amplifier can be also controlled by the selecting stage. Please note that the transconductance of an input stage depends on the number of turned-on transistor elements of the input stage. As can be seen from FIG. 2, each transistor element in an input stage is coupled to a transistor element of a selecting stage through a series connection. Therefore, the number of turned-on transistor elements in the selecting stage decides the number of turned-on transistor element of the input stage. To put it another way, the number of turned-on transistor elements in the selecting stage sets the transconductance of the input stage. Briefly summarized, when an output stage in an amplifier block is required to be enabled for generating a processed signal, each of the transistor elements in a selecting stage of the same amplifier block is selectively turned on or turned off to thereby control a transconductance of an input stage in the same amplifier block, wherein at least one of the transistor elements in the selecting stage should be turned on.

Moreover, to achieve low noise figure, the input impedance of the input stages viewed from the matching network 210 should be constant. Assume that transistor elements in all of the input stages 204_1-204_N have the same size. Therefore, the number of turned-on transistor elements in all of the input stages 204_1-204_N can be fixed when the number of enabled output stages in the amplifier blocks 202_1-202_N is changed. More specifically, the number of turned-on transistor elements in all of the input stages 204_1-204_N is fixed, regardless of the number of enabled output stages in the amplifier blocks 202_1-202_N. In this way, as the sufficient transconductance can be set without changing the number of enabled output stages in the amplifier blocks 202_1-202_N, the input matching can satisfy all operational modes of the signal amplification circuit 200.

In an alternative design, the output stages 208_1-208_N may be used to control the operational mode of the signal amplification circuit 200. In other words, in addition to setting the gain applied to a signal passing therethrough, each of the output stages 208_1-208_N is further arranged to determine if a processed signal is allowed to be generated at a corresponding output port, and therefore control whether the output stage should be enabled. Taking the output stage 208_1 for example, if the output stage 208_1 is required to be enabled for generating the corresponding processed signal VOUT_1, the output stage 208_1 is enabled by making each of the transistor element pairs 212_11-212_1K have one turned-on transistor element and one turned-off transistor element. However, if the output stage 208_1 is not required to be enabled for generating the corresponding processed signal VOUT_1, the output stage 208_1 is disabled by turning off both of the first transistor element and the second transistor element included in each of the transistor element pairs 212_11-112_1K. As a result, all of the transistor elements MS_11-MS_1J will be turned off regardless of the voltage levels of the control voltages $V_{SW\_11}$-$V_{SW\_1J}$. In one exemplary design, a control voltage applied to each transistor element included in the selecting stages 206_1-206_N is at a high logic level, and the output stages 208_1-208_N control the signal amplification circuit 200 to operate under the shared mode or combo mode by setting the first control signals M1_1-M1_K, . . . , and MN_1-MN_K and the second control signals M1'_1-M1'_K, . . . , and MN'_1-MN'_L. For example, when only the WiFi function of the multi-radio device is required to be active (i.e., the signal amplification circuit 200 should operate under the shared mode), the output stage 208_1 is enabled, whereas all of the output stages in the remaining amplifier blocks are disabled. In addition, the gain of the enabled output stage 208_1 should be properly configured to meet the WiFi requirements. Similarly, when only the Bluetooth function of the multi-radio device is required to be active (i.e., the signal amplification circuit 200 should operate under the shared mode), the output stage 208_N is turned on, whereas all of the output stages in the remaining amplifier blocks are disabled. In addition, the gain of the enabled output stage 208_N should be properly configured to meet the Bluetooth requirements. However, when both of the WiFi function and Bluetooth function of the multi-radio device are required to be active (i.e., the signal amplification circuit 200 should operate under the combo mode), the output stages 208_1 and 208_N are both enabled at the same time, whereas all of the output stages in the remaining amplifier blocks are disabled. In addition, the gains of the concurrently enabled output stages 208_1 and 208_N should be properly configured to meet the requirements.

Figure 3:
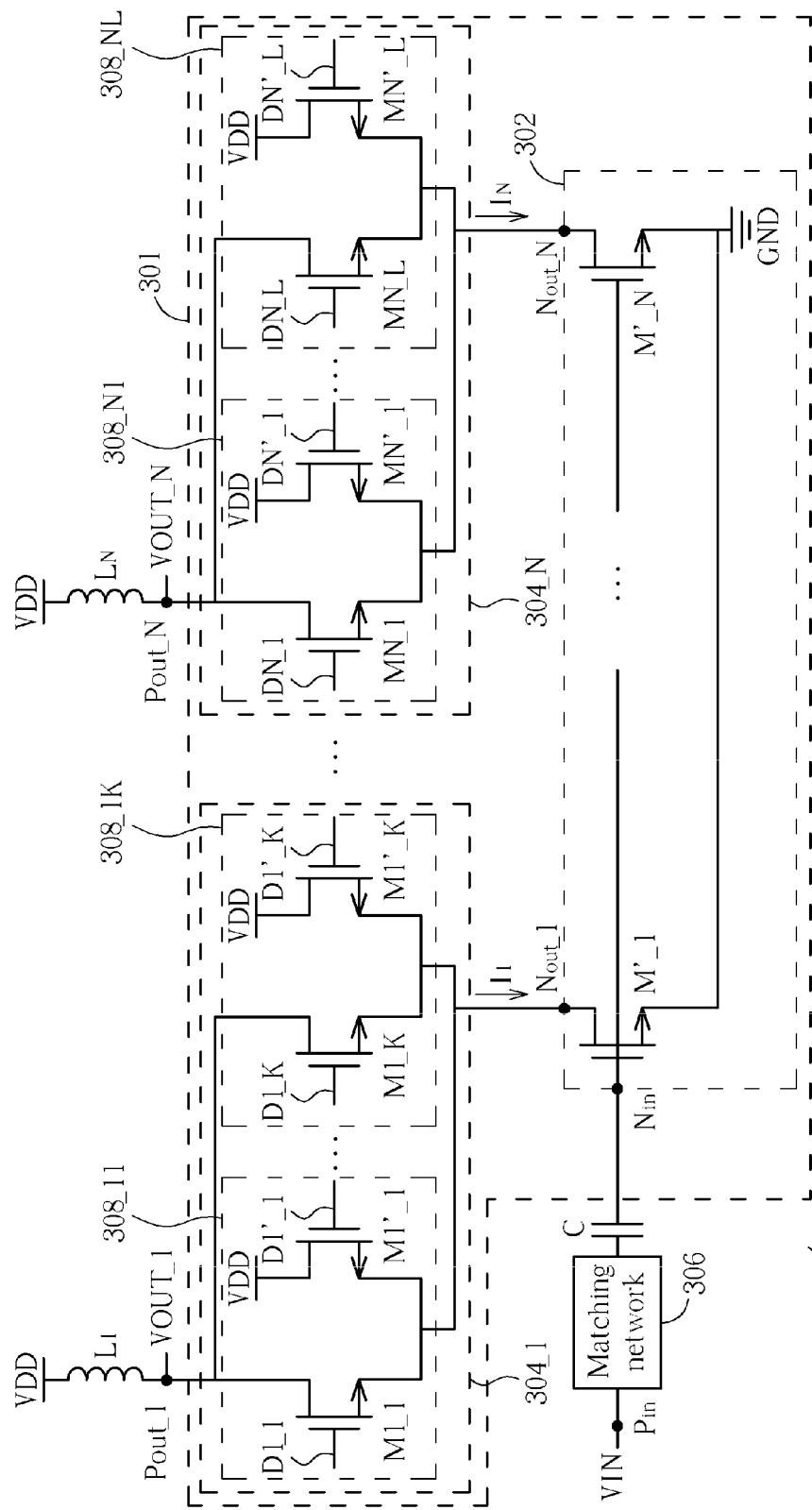
FIG. 3 is a diagram illustrating a third exemplary implementation of a signal amplification circuit according to the present invention.

FIG. 3 is a diagram illustrating a third exemplary implementation of a signal amplification circuit according to the present invention. Similar to the exemplary signal amplification circuit 100 shown in FIG. 1, the exemplary signal amplification circuit 300 is for processing an input signal VIN to be received or transmitted. That is, the signal amplification circuit 300 can be part of a receiver or a transmitter. In this exemplary implementation, the signal amplification circuit 300 includes an amplifier block 301 and a matching network 306. The amplifier block 301 includes, but is not limited to, an input stage 302 and a plurality of output stages 304_1-304_N. The matching network 306 is coupled between an input port $P_{in}$ of the signal amplification circuit 300 and an input node $N_{in}$ of the input stage 302, and implemented for providing desired impedance matching. The input signal VIN is received by the input node $N_{in}$ of the input stage 302 via the matching network 306 and an AC coupling capacitor C, and then processed by the input stage 302 according to a transconductance of the input stage 302. As shown in FIG. 3, the input stage 302 includes a plurality of transistor elements M'_1-M'_N coupled to a plurality of output nodes $N_{out\_1}$-$N_{out\_N}$, respectively. More specifically, regarding each of the transistor elements M_1'-M'_N, a control terminal is coupled to the input node $N_{in}$, a first connection terminal is coupled to an output node $N_{out\_1}$, . . . , or $N_{out\_N}$ of the input stage 302, and a second connection terminal is coupled to a reference voltage (e.g., the ground voltage GND). Therefore, second connection terminals of the transistor elements M_1'-M'_N are coupled to each other. It should be noted that the number of the implemented transistor elements M_1'-M'_N can be adjusted according to the actual design consideration. In one exemplary embodiment, the transistor elements M_1'-M'_N have the same size. Thus, when the signal amplification circuit 300 operates under a shared mode, the input impedance viewed by the matching network 306 is constant. For example, the input signal VIN is converted into an intermediate signal $I_1$ at the output node $N_{out\_1}$ of the input stage 302 when the transistor element M'_1 is turned on, and the input signal VIN is converted into an intermediate signal $I_N$ at the output node $N_{out\_}N$ of the input stage 302 when the transistor element M'_N is turned on, wherein $I_1$ is equal to $I_N$ due to the transistor elements M'_1 and M'_N with the same size.

The output stages 304_1-304_N are coupled to a plurality of output ports $P_{out\_}1$-$P_{out\_}N$ of the signal amplification circuit 300, respectively, and are arranged to generate a plurality of processed signals VOUT_1-VOUT_N, respectively. As shown in FIG. 3, the output stages 304_1-304_N are directly connected to output nodes $N_{out\_}1$-$N_{out\_}N$ of the input stage 302, respectively. Each of the output stages 304_1-304_N generates a corresponding processed signal to a corresponding output port according to a gain and a signal derived from an intermediate signal of a coupled input stage when the output stage is enabled. In this exemplary implementation, each output stage includes a plurality of transistor elements. As can be seen from FIG. 3, the output stage 304_1 includes a plurality of transistor element pairs 308_11-308_1K, wherein each of the transistor element pairs 308_11-308_1K includes a first transistor element (e.g., M1_1, . . . , or M1_K) and a second transistor element (e.g., M1'_1, . . . , or M1'_K). Similarly, the output stage 304_N includes a plurality of transistor element pairs 308_N1-308_NL, wherein each of the transistor element pairs 308_N1-308_NL includes a first transistor element (e.g., MN_1, . . . , or MN_L) and a second transistor element (e.g., MN'_1, . . . , or MN'_L). The first transistor elements M1_1-M1_K, . . . , and MN1-MN_L have control terminals for receiving first control signals D1_1-D1_K, . . . , and DN_1-DN_L, first connection terminals coupled to the corresponding output ports $P_{\_out\_}1$-$P_{\_out\_}N$, and second connection terminals coupled to corresponding output nodes $N_{out\_}1$-$N_{out\_}N$ of the input stage 302; in addition, the second transistor elements M1'_1-M1'_K, . . . , and MN'_1-MN'_L have control terminals for receiving second control signals D1'_1-D1'_K, . . . , and DN'_1-DN'_L, first connection terminals coupled to a reference voltage (e.g., the supply voltage VDD), and second connection terminals coupled to corresponding output nodes $N_{out\_}1$-$N_{out\_}N$ of the input stage 302. Therefore, regarding the output stage 304_1, the current passing through a corresponding inductive load (i.e., the inductor $L_1$) has a maximum value (i.e., the current $I_1$ passing through the transistor element M'_1 of the input stage 302) when all of the first transistor elements M1_1-M1_K are turned on under the control of the first control signals D1_1-D1_K and all of the second transistor elements M1'_1-M1'_K are turned off under the control of the second control signals D1'_1-D1'_K. Similarly, regarding the output stage 304_N, the current passing through a corresponding inductive load (i.e., the inductor $L_N$) has a maximum value (e.g., the current $I_N$ passing through the transistor element M'_N of the input stage 302) when all of the first transistor elements MN_1-MN_K are turned on under the control of the first control signals DN'_1-DN'_K and all of the second transistor elements MN'_1-MN'_K are turned off under the control of the second control signals DN'_1-DN'_K. As a person skilled in the art can readily understand operations of the output stages 304_1-304_N after reading above paragraphs directed to the output stages shown in FIG. 1, further description is omitted here for brevity.

In addition to setting the gain applied to a signal passing therethrough, each of the output stages 304_1-304_N is arranged to further control if a processed signal is allowed to be generated at a corresponding output port, and therefore control whether the output stage should be enabled. That is, the output stages 304_1-304_N also control the operation of the signal amplification circuit 100 under the shared mode. More specifically, a plurality of specific output stages included in the output stages 304_1-304_N are enabled in a time-division manner. Taking the output stage 304_1 for example, if the output stage 304_1 is required to be enabled for generating the corresponding processed signal VOUT_1, the output stage 304_1 is enabled by making each of the transistor element pairs 308_11-308_1K have one turned-on transistor element and one turned-off transistor element; however, if the output stage 304_1 is not required to be enabled for generating the corresponding processed signal VOUT_1, the output stage 304_1 is disabled by turning off both of the first transistor element and the second transistor element included in each of the transistor element pairs 308_11-308_1K. As a result, when the output stage 304_1 is disabled, the transistor element M'_1 in the input stage 302 will be turned off regardless of the voltage level of the input signal VIN.

Suppose that the output port $P_{out\_}1$ is coupled to a first radio signal processing system (e.g., a WiFi receiver/transmitter) and the output port $P_{out\_}N$ is coupled to a second radio signal processing system (e.g., a Bluetooth receiver/transmitter). When only the WiFi function of the multi-radio device is required to be active, the output stage 304_1 is enabled, whereas the remaining output stages in the signal amplification circuit 300 are disabled. In addition, the gain of the enabled output stage 304_1 should be properly configured to meet the WiFi requirements. Similarly, when only the Bluetooth function of the multi-radio device is required to be active, the output stage 304_N is turned on, whereas the remaining output stages in the signal amplification circuit 300 are disabled. In addition, the gain of the enabled output stage 304_N should be properly configured to meet the Bluetooth requirements. If the output stages 304_1 and 304_N are enabled alternately under the mode, the signal amplification circuit 300 refers to the input signal VIN to generate the processed signal VOUT_1 for WiFi connection and the other processed signal VOUT_N for Bluetooth connection alternately.

Figure 4:
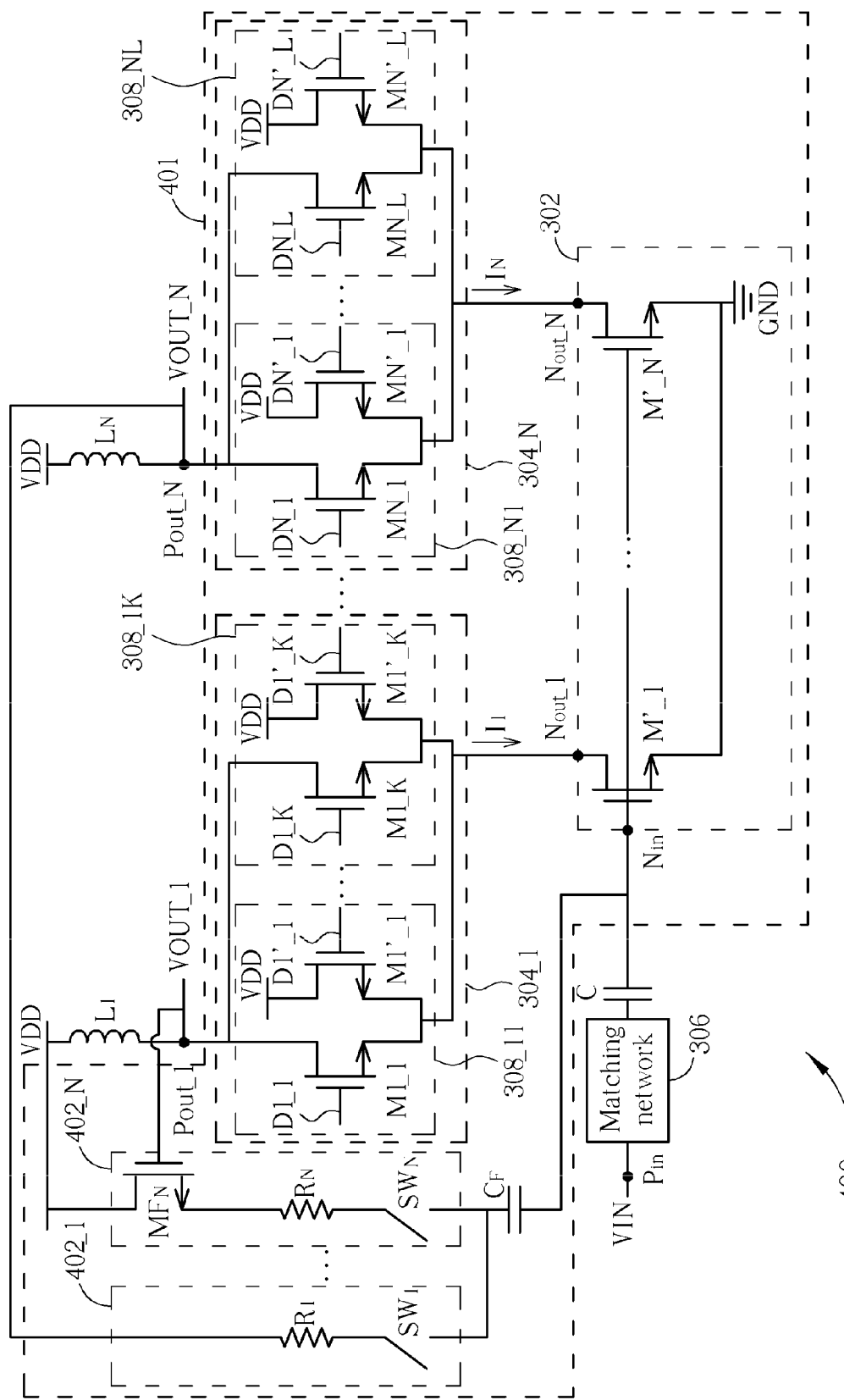
FIG. 4 is a diagram illustrating a fourth exemplary implementation of a signal amplification circuit according to the present invention.

FIG. 4 is a diagram illustrating a fourth exemplary implementation of a signal amplification circuit according to the present invention. The circuit configuration of the exemplary signal amplification circuit 400 is similar to that of the exemplary signal amplification circuit 300. The major difference is that the amplifier block 401 further includes a plurality of feedback elements coupled to the output ports VOUT_1-VOUT_N, respectively. More specifically, each of feedback elements is coupled between a specific output port and the input node $N_{in}$ of the input stage 302, and used for feeding a specific processed signal generated at the specific output port to the input node $N_{in}$ of the input stage 302 when a specific output stage coupled to the specific port is enabled. In addition, an AC coupling capacitor $C_F$ is placed between the input stage 302 and the feedback elements 402_1-402_N. Please note that a feedback element may be implemented by an active feedback element or a resistive feedback element. In a case where the output port $P_{out\_}1$ is coupled to a WiFi receiver/transmitter and the output port $P_{out\_}N$ is coupled to a Bluetooth receiver/transmitter, the feedback element 402_N is an active feedback element, including a transistor element $MF_N$, a resistor $R_N$, and a switch $SW_N$, as the WiFi application allows more current consumption, wherein the switch $SW_N$ is switched on only when the coupled output stage 304_1 of the signal amplification circuit 400 operating under a shared mode is enabled. Additionally, regarding the feedback element 402_1, it is a resistive element, including a resistor $R_1$ and a switch $SW_1$, as the Bluetooth application allows less current consumption, wherein the switch $SW_1$ is switched on only when the coupled output stage 304_N of the signal amplification circuit 400 operating under the shared mode is enabled.

Figure 5A:
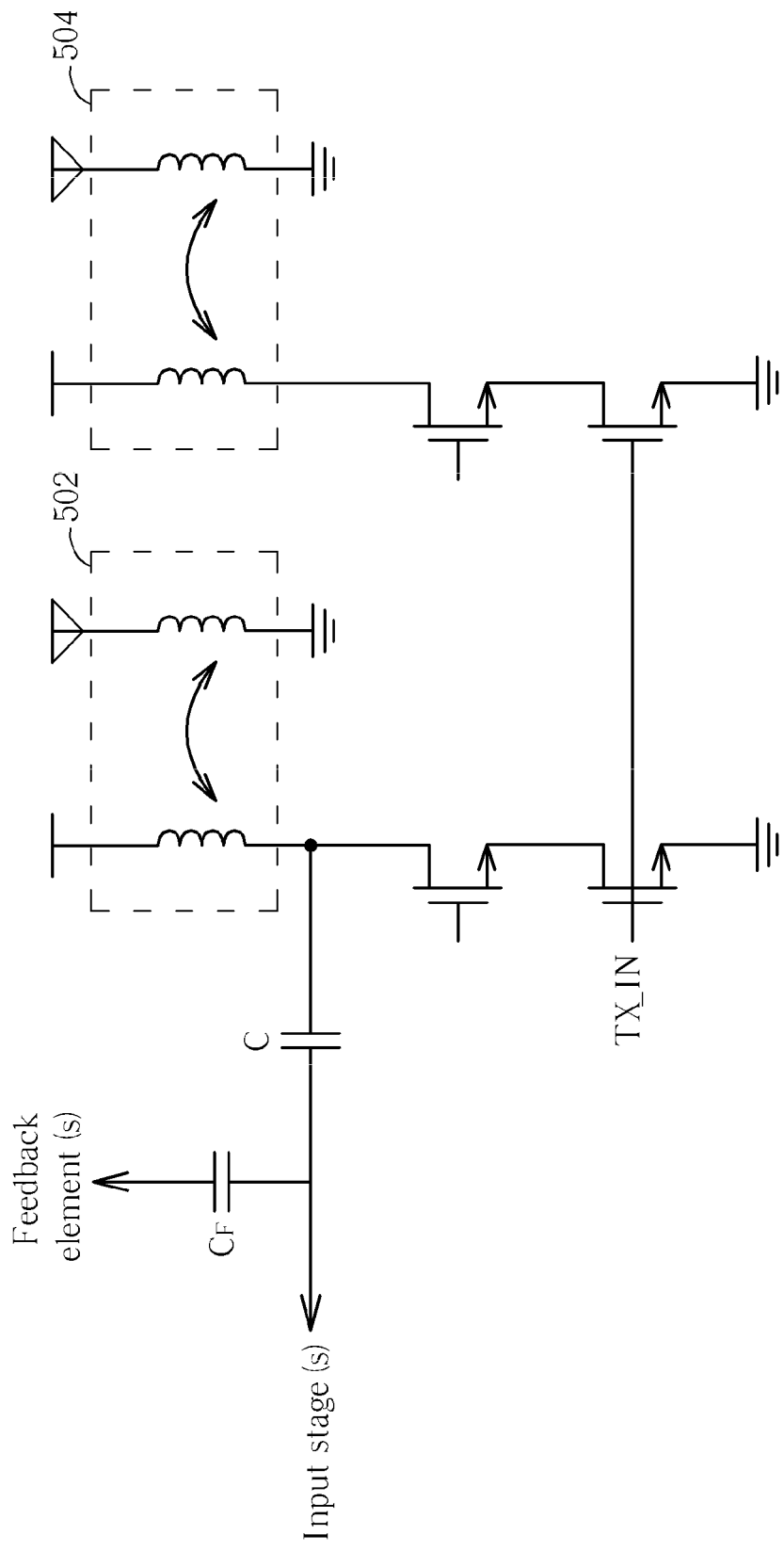
FIG. 5A is a simplified diagram illustrating a portion of a transceiver with a matching network shared between a transmitting circuit and a receiving circuit according to one exemplary design of the present invention.

With the feedback elements implemented in the signal amplification circuit 400, the input matching performance can be improved greatly. For example, a wider input frequency range can be covered by the signal amplification circuit 400. In a case where the matching network 306 is shared between a transmitting circuit and a receiving circuit which has the feedback elements 402_1-402_N, the output stages 304_1 -304_N and the input stage 302 included therein, the transmitting circuit therefore outputs a transmitting signal via the matching network 306. Please refer to FIG. 5 in conjunction with FIG. 4. FIG. 5A is a simplified diagram illustrating a portion of a transceiver with a matching network shared between a transmitting circuit and a receiving circuit according to one exemplary design of the present invention. As shown in the figure, the transmitting circuit and the receiving circuit of the transceiver have a single-ended configuration, and there are inductors acting as output loads of the transmitting circuit. For example, according to actual design consideration, the transformers 502 and 504 shown in FIG. 5A may be transformer-based balanced-to-unbalanced (balun) circuits implemented for impedance matching and balanced-to-unbalanced/unbalanced-to-balanced conversion to thereby generate a balanced (differential) signal according to an unbalanced (single-ended) signal and generate an unbalanced (single-ended) signal according to a balanced (differential) signal. However, using balun circuits in the transceiver and realizing balun circuits by transformers is for illustrative purposes only, and is not meant to be a limitation of the present invention. The transmitting signal TX_IN is outputted via the transformers 502 and 504 as inductors in the transformers 502 and 504 serve as output loads of the transmitting circuit. In general, the design of the receiving circuit requires the impedance matched to a desired value for achieving the optimal receiving performance, but the design of the transmitting circuit requires the impedance deviated from the desired value for achieving the optimal transmitting performance. Therefore, the matching network 306 may be particularly designed to meet the requirements of the transmitting circuit. When the receiving circuit operates, at least one of the aforementioned feedback elements 402_1-402_N can be used to improve the input matching to meet the requirements of the receiving circuit. In this way, both of the receiving circuit and the transmitting circuit sharing the same matching network can have the optimal performance. By way of example, but not limitation, the transmitting circuit may be realized using the circuit configuration shown in FIG. 2/FIG. 3 when the exemplary design shown in FIG. 5A is employed by the transceiver.

Figure 5B:
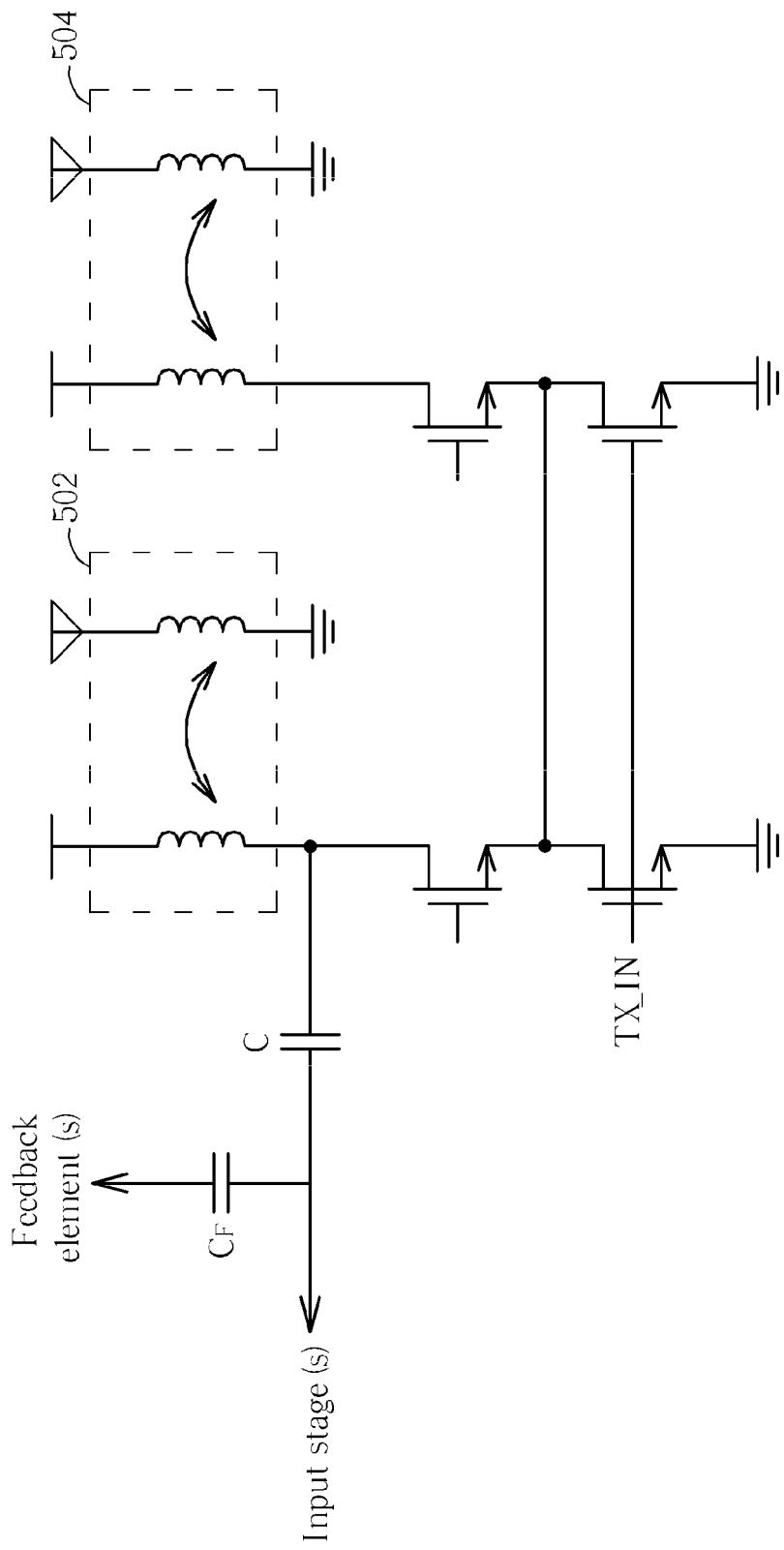
FIG. 5B is a simplified diagram illustrating a portion of a transceiver with a matching network shared between a transmitting circuit and a receiving circuit according to another exemplary design of the present invention.

FIG. 5B is a simplified diagram illustrating a portion of a transceiver with a matching network shared between a transmitting circuit and a receiving circuit according to another exemplary design of the present invention. The major difference between the exemplary designs in FIG. 5B and FIG. 5A is that the transistors with gate electrodes used for receiving the transmitting signal TX_IN have drain electrodes coupled to each other. By way of example, but not limitation, the transmitting circuit may be realized using the circuit configuration shown in FIG. 1 when the exemplary design shown in FIG. 5B is employed by the transceiver. As a person skilled in the art can readily understand technical features of the exemplary design shown in FIG. 5B after reading above paragraph directed to the exemplary design shown in FIG. 5A, further description is omitted here for brevity.

As mentioned above, each of the feedback elements 402_1-402_N can be properly designed to adjust the input matching. In an alternative design, the signal amplification circuit 400 shown in FIG. 4 may operate under a combo mode due to the implemented feedback elements 402_1-402_N. For example, the input matching is constant no matter how many output stages are enabled concurrently. In this way, the signal amplification circuit 400 has a low noise figure.

Figure 6:
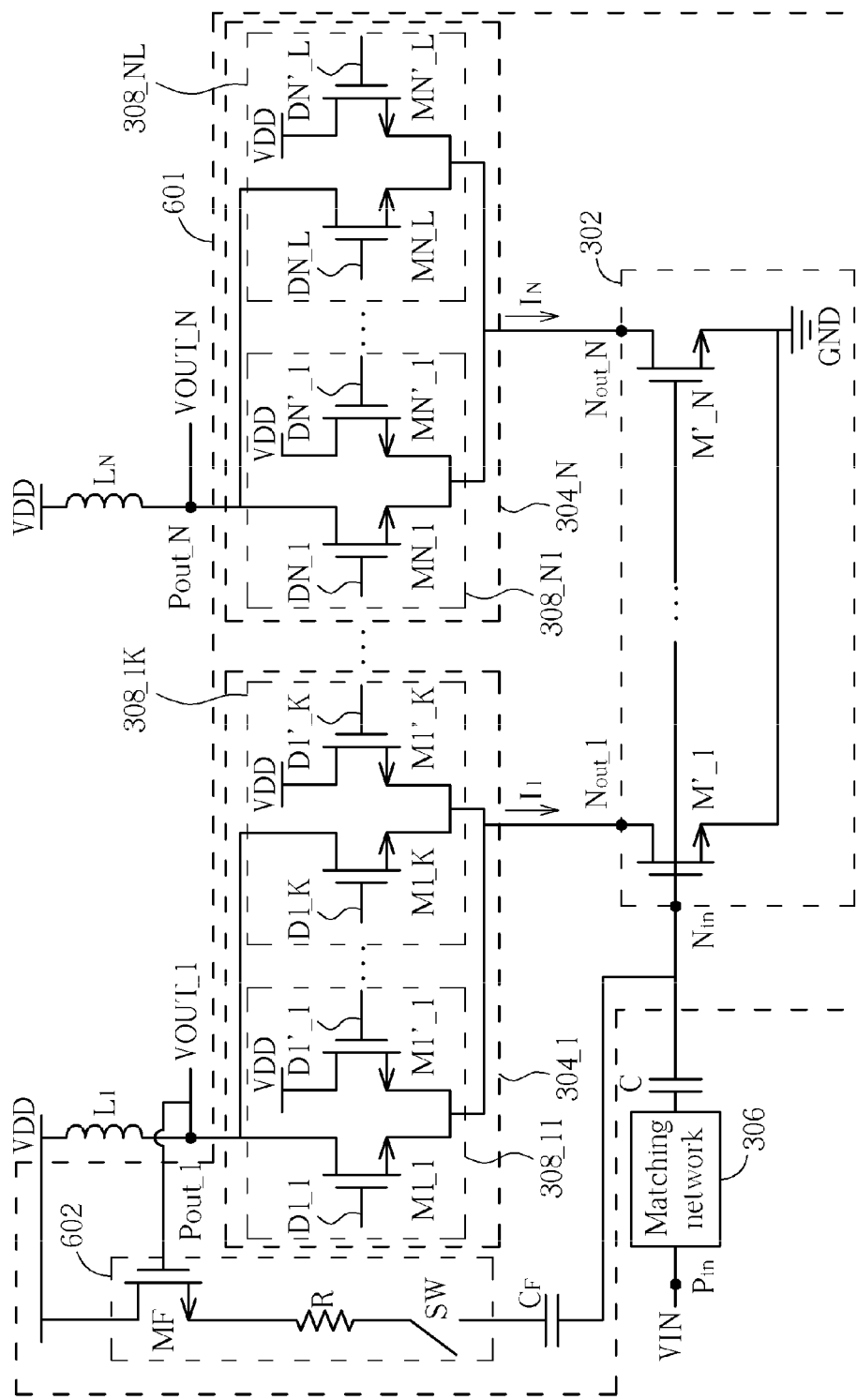
FIG. 6 is a diagram illustrating a fifth exemplary implementation of a signal amplification circuit according to the present invention.

In the exemplary implementation shown in FIG. 4, each output port of the signal amplification circuit 400 is coupled to one feedback element. However, to save power consumption, some of the feedback elements 402_1-402_N may be omitted. FIG. 6 is a diagram illustrating a fifth exemplary implementation of a signal amplification circuit according to the present invention. Compared with the amplifier block 401 shown in FIG. 4, the amplifier block 601 has only one feedback element 602, including a transistor element MF, a resistor R and a switch SW. For example, the output port $P_{out\_1}$ is coupled to a first radio signal processing system (e.g., a WiFi receiver/transmitter) and the output port $P_{out\_N}$ is coupled to a second radio signal processing system (e.g., a Bluetooth receiver/transmitter). Therefore, only the WiFi receiver/transmitter adopts the signal feedback for enhancing the input matching when enabled in the signal amplification circuit 600 which operates under the shared mode.

Figure 7:
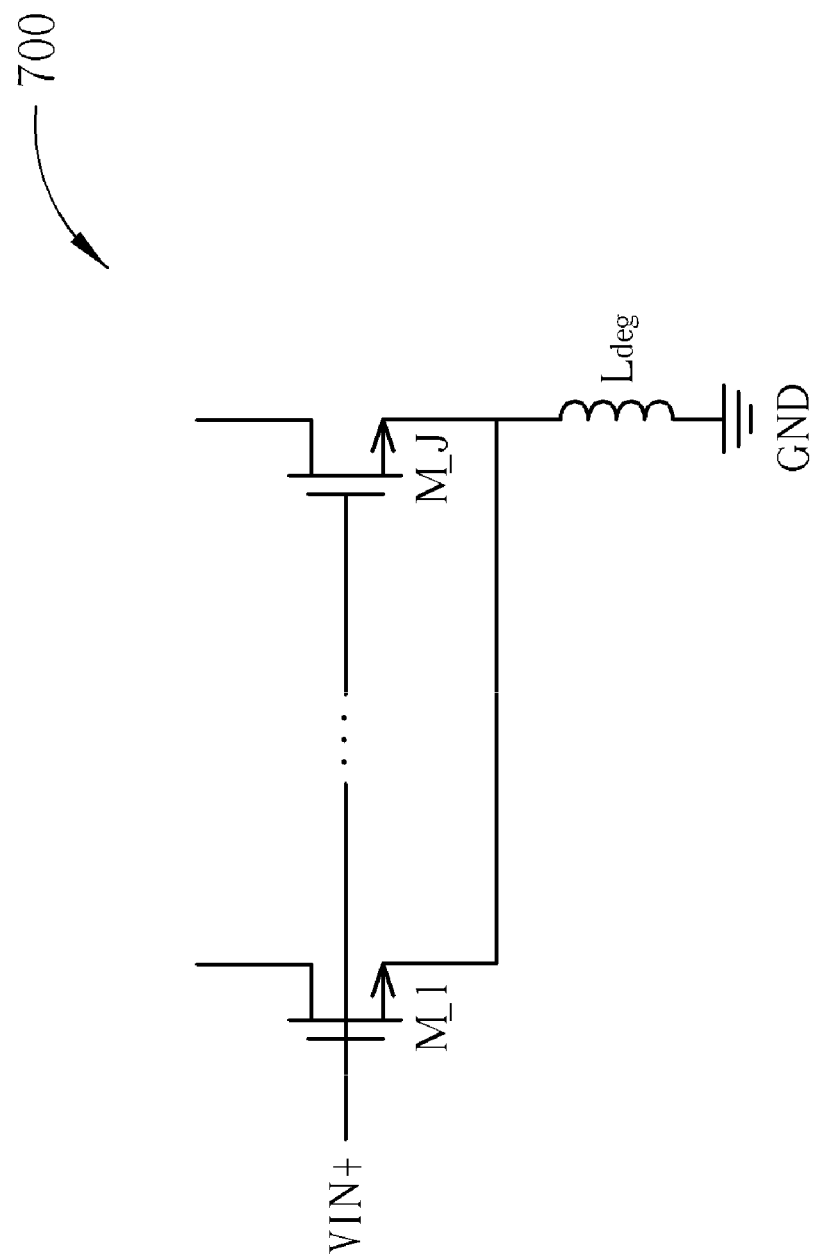
FIG. 7 shows an exemplary implementation of an input stage used in a differential signal amplification circuit according to the present invention.

In above exemplary embodiments, each of the signal amplification circuits 100, 200, 300, 400, and 600 has a single-ended configuration. However, this is for illustrative purposes only. That is, the same conception of the present invention may be applied to a differential signal amplification circuit. For example, the balun circuit 502/504 may be employed to convert an unbalanced input (i.e., a single-ended input) into a balanced input (i.e., a differential input) having a positive signal (e.g., VIN+) and a negative signal (e.g., VIN−), wherein each of the positive signal and the negative signal acts as an input signal fed into one proposed exemplary signal amplification circuit of the present invention. In addition, the input stages of the signal amplification circuits 100, 200, 300, 400, and 600 should be properly modified to make the modified signal amplification circuit operate under a differential mode. For example, a degeneration inductor $L_{deg}$ is added to the input stage, and has one end coupled to a reference voltage (e.g., VDD or GND) and the other end coupled to all of the transistor element device(s) included in the input stage. FIG. 7 shows an exemplary implementation of an input stage used in a differential signal amplification circuit according to the present invention. By way of example, but not limitation, the input stage 102 shown in FIG. 1 may be replaced by the input stage 700 which receives a positive signal VIN+ of a differential input.

Please note that above-mentioned exemplary signal amplification circuits are for illustrative purposes only. For example, the circuit components indicated by the same reference numeral, the same component name or the same circuit symbol in different signal amplification circuits do not imply that the circuit components in different signal amplification circuits are required to be exactly the same. By way of example, but not limitation, the matching networks 108, 210 and 306 may be realized by the same matching circuit structure (e.g., an LC-based matching network) or different matching circuit structures; similarly, the output stages 106_1, 208_1 and 304-1 (or 106_N, 208_N and 304-N) may be realized by the same output stage structure or different output stage structures. In other words, modifications made to above-mentioned exemplary signal amplification circuits without departing from the spirit of the present invention are feasible.

Those skilled in the art will readily observe that numerous modifications and alterations of the device and method may be made while retaining the teachings of the invention.

What is claimed is:

1. A signal amplification circuit for processing an input signal, comprising:
   an input stage, having an input node for receiving the input signal and an output node for outputting an intermediate signal;
   a plurality of output stages, coupled to a plurality of output ports of the signal amplification circuit, respectively, wherein each of the output stages generates a corresponding processed signal to a corresponding output port according to a gain and the intermediate signal when enabled; and
   a selecting stage, arranged for selectively coupling the output node of the input stage to at least one of the output stages, wherein when one of the processed signals is not required to be outputted from the corresponding output stage, the corresponding output node of the input stage is disconnected from the corresponding output stage.

2. The signal amplification circuit of claim 1, wherein the selecting stage is arranged to couple the output node of the input stage to a plurality of specific output stages included in the output stages, concurrently.

3. The signal amplification circuit of claim 2, wherein the selecting stage is arranged to increase isolation between the specific output stages.

4. The signal amplification circuit of claim 1, wherein the selecting stage comprises a plurality of transistor elements respectively corresponding to the output stages; each of the transistor elements has a control terminal for receiving a control signal, a first connection terminal coupled to a corresponding output stage, and a second connection terminal coupled to the output node of the input stage, wherein the transistor element is turned on by the control signal when the corresponding output stage is required to be enabled for generating the corresponding processed signal, and the transistor element is turned off by the control signal when the corresponding output stage is not required to be enabled for generating the corresponding processed signal.

5. The signal amplification circuit of claim 1, wherein each of the output stages is arranged to control the gain and is further arranged to control whether the output stage is enabled.

6. A signal amplification circuit for processing an input signal, comprising:
   a plurality of individual amplifier blocks, coupled to a plurality of output ports of the signal amplification circuit, respectively, wherein each of the individual amplifier blocks comprises:
      an input stage, having an input node for receiving the input signal;
      an output stage, coupled to a corresponding output port of the signal amplification circuit, wherein the output stage generates a corresponding processed signal to the corresponding output port according to a gain and a signal derived from an intermediate signal of the input stage when enabled; and
      a selecting stage, arranged for selectively coupling the input stage to the output stage; wherein input nodes of input stages of the individual amplifier blocks are coupled to one another and arranged to receive a same signal level of the input signal.

7. The signal amplification circuit of claim 6, wherein selecting stages of a plurality of specific amplifier blocks included in the individual amplifier blocks are arranged to couple corresponding input stages of the specific amplifier blocks to corresponding output stages of the specific amplifier blocks, concurrently.

8. The signal amplification circuit of claim 6, wherein:
   the input stage has a plurality of output nodes and comprises:
      a plurality of first transistor elements, each having a control terminal coupled to the input node of the input stage, a first connection terminal coupled to an output node of the input stage, and a second connection terminal, wherein second connection terminals of the first transistor elements are coupled to each other;
   the selecting stage comprises:
      a plurality of second transistor elements coupled to the output nodes of the input stage, respectively, each of the second transistor elements having a control terminal for receiving a control signal, a first connection terminal coupled to the output stage, and a second connection terminal coupled to a corresponding output node of the input stage, wherein at least one of the second transistor elements is turned on by a corresponding control signal when the output stage is required to be enabled for generating the corresponding processed signal, and all of the second transistor elements are turned off when the output stage is not required to be enabled for generating the corresponding processed signal.

9. The signal amplification circuit of claim 8, wherein when the output stage is required to be enabled for generating the processed signal, each of the second transistor elements is selectively turned on or turned off by the control signal to control a transconductance of the input stage.

10. The signal amplification circuit of claim 8, wherein a number of second transistor elements that are turned on in the individual amplifier blocks is fixed when a number of output stages that are enabled in the individual amplifier blocks is changed.

11. The signal amplification circuit of claim 6, wherein the output stage is arranged to control the gain and is further arranged to control whether the output stage is enabled.

12. A signal amplification circuit for processing an input signal, comprising:
   an input stage, having an input node for receiving the input signal and a plurality of output nodes; and
   a plurality of output stages, coupled to a plurality of output ports of the signal amplification circuit, respectively, wherein the output stages are directly connected to the output nodes of the input stage, respectively, and each of the output stages generates a corresponding processed signal to a corresponding output port according to a gain and a signal derived from an intermediate signal of the input stage when enabled, where one of the output stages is arranged to generate one processed signal to a first signal processing system rather than a second signal processing system, and another of the output stages is arranged to generate another processed signal to the second signal processing system rather than the first signal processing system:
   wherein the input stage comprises:
      a plurality of transistor elements, coupled to the output stages, respectively, each of the transistor elements having a control terminal coupled to the input node of the input stage and arranged to receive a same signal level of the input signal.

13. The signal amplification circuit of claim 12, wherein a plurality of specific output stages included in the output stages are enabled in a time-division manner.

14. The signal amplification circuit of claim 13, wherein each of the transistor element further has a first connection terminal coupled to an output node of the input stage, and a second connection terminal, wherein second connection terminals of the transistor elements are coupled to each other, and the transistor elements have a same size.

15. The signal amplification circuit of claim 12, wherein each of the output stages is arranged to control the gain and is further arranged to control whether the output stage is enabled.

16. The signal amplification circuit of claim 12, further comprising:
   a feedback element, coupled between the input node of the input stage and a specific output port of the signal amplification circuit, for feeding a specific processed signal generated at the specific output port to the input node of the input stage when a specific output stage coupled to the specific output port is enabled.

17. The signal amplification circuit of claim 16, further comprising:
   a matching network, coupled to the input node of the input stage, for providing impedance matching;
   wherein the matching network is shared between a transmitting circuit and a receiving circuit, having the feedback element, the input stage and the output stages included therein, such that the transmitting circuit outputs a transmitting signal via the matching network.

18. The signal amplification circuit of claim 12, further comprising:
   a plurality of feedback element, coupled between the input node of the input stage and a plurality of specific output ports of the signal amplification circuit, for feeding processed signals generated at the specific output ports to the input node of the input stage when specific output stages respectively coupled to the specific output ports are enabled concurrently.

* * * * *